US006483706B2

(12) United States Patent
Vinciarelli et al.

(10) Patent No.: US 6,483,706 B2
(45) Date of Patent: Nov. 19, 2002

(54) HEAT DISSIPATION FOR ELECTRONIC COMPONENTS

(75) Inventors: Patrizio Vinciarelli, Boston, MA (US); John R. Saxelby, Jr., Maynard, MA (US)

(73) Assignee: VLT Corporation, San Antonio, TX (US)

( * ) Notice: Subject to any disclaimer, the term of this patent is extended or adjusted under 35 U.S.C. 154(b) by 0 days.

(21) Appl. No.: 09/746,644

(22) Filed: Dec. 22, 2000

(65) Prior Publication Data

US 2002/0080587 A1 Jun. 27, 2002

(51) Int. Cl.[7] .................................................. H05K 7/20
(52) U.S. Cl. ........................ 361/713; 361/699; 361/704; 257/709; 174/16.3
(58) Field of Search ................................ 361/702–710, 361/714–727, 753, 767, 780, 792, 794–795; 257/668, 679, 706–727, 687, 756, 797; 165/80.2, 80.3, 80.4, 165, 185; 174/16.3, 52.4

(56) References Cited

U.S. PATENT DOCUMENTS

| | | | | |
|---|---|---|---|---|
| 3,676,745 A | | 7/1972 | Tryweek | |
| 4,784,974 A | * | 11/1988 | Butt | ............................ 437/221 |
| 5,018,004 A | * | 5/1991 | Okinaga et al. | ............... 357/74 |
| 5,043,796 A | * | 8/1991 | Lester | .......................... 357/81 |
| 5,200,809 A | * | 4/1993 | Kwon | ........................ 257/707 |
| 5,323,295 A | | 6/1994 | Pines | |
| 5,365,403 A | | 11/1994 | Vinciarelli et al. | |
| 5,367,439 A | | 11/1994 | Mayer et al. | |
| 5,467,251 A | | 11/1995 | Katchmar | |
| 5,644,103 A | | 7/1997 | Pullen et al. | |
| 5,866,943 A | * | 2/1999 | Metrol | ......................... 257/712 |
| 5,907,189 A | * | 5/1999 | Metrol | ......................... 257/787 |
| 5,909,056 A | * | 6/1999 | Metrol | ......................... 257/704 |
| 5,940,271 A | * | 8/1999 | Metrol | ......................... 361/704 |
| 5,987,740 A | | 11/1999 | Andrus et al. | |
| 6,008,536 A | * | 12/1999 | Metrol | ......................... 361/704 |
| 6,011,304 A | * | 1/2000 | Metrol | ......................... 257/706 |
| 6,246,583 B1 | * | 1/2001 | Cronin et al. | ................ 361/704 |
| 6,195,256 B1 | * | 2/2001 | Tiziani et al. | ................ 361/704 |
| 6,282,095 B1 | * | 8/2001 | Houghton et al. | ........... 361/704 |

FOREIGN PATENT DOCUMENTS

| | | |
|---|---|---|
| GB | 2177965 | 2/1987 |
| JP | 4-291749 | 10/1992 |
| JP | 5-243457 | 9/1993 |

OTHER PUBLICATIONS

Howard Green et al., "Reducing MCM Fabrication Costs", Electronic Packaging & Production, pp. 50–54, May 1996.
Roland Heitmann, "The Ultimate Connections: BGA and Flip Chip Attachment", Electronic Packaging and Production, May 1996.
Charles Bauer, "Packaging Assembly Technology Directions", Electronic Packaging & Production, pp. 79–82, May 1996.
U.S. patent application Ser. No. 08/337,269, filed Nov. 10, 1994, "Packaging Electrical Components".
Proceedings of 1996 International Electronics Packaging Conf. pp. 192–202 by T. Leniham et al, Published by Electron. Packaging Soc. Sep. 29–Oct. 1, 1996.

* cited by examiner

Primary Examiner—Darren Schuberg
Assistant Examiner—Michael Datskovsky
(74) Attorney, Agent, or Firm—Fish & Richardson P.C.

(57) ABSTRACT

Heat is conducted, from a heat generating electronic device that is mounted in a gap between a circuit board and a heat dissipator, along a path that includes a path segment that passes along conductive runs on the circuit board and another segment that spans the gap at a location adjacent to the device, the other path segment being spanned predominantly by a non-metallic piece that has a thermal conductivity of at least 7 W/m-°K.

17 Claims, 4 Drawing Sheets

THERMAL RESISTANCE CALCULATION "NOMINAL DIMENSIONS"

| material | Thermal Conductivity K w/mk | Dimensions L inch | W inch | Thick inch | Rise / Watt |
|---|---|---|---|---|---|
| silicon | 80.0 | 0.062 | 0.160 | 0.0100 | 0.5 |
| die attach | 1.0 | 0.062 | 0.160 | 0.0015 | 6.0 |
| copper | 400.0 | 0.062 | 0.160 | 0.0080 | 0.1 |
| solder | 50.0 | 0.062 | 0.160 | 0.0020 | 0.2 |
| copper | 400.0 | 0.004 | 0.240 | 0.0300 | 3.1 |
| solder | 50.0 | 0.050 | 0.240 | 0.0020 | 0.1 |
| copper | 400.0 | 0.050 | 0.240 | 0.0050 | 0.0 |
| alumina | 25.0 | 0.050 | 0.240 | 0.0300 | 3.9 |
| copper | 400.0 | 0.050 | 0.240 | 0.0054 | 0.0 |
| solder | 50.0 | 0.050 | 0.240 | 0.0050 | 0.3 |
| | | | half die | total | 14.2 |
| | | | full die | 7.1 | |
| | | | | | |
| | | | | | |
| | | | | | |
| silicon | 80.0 | 0.125 | 0.160 | 0.0100 | 0.2 |
| die attach | 1.0 | 0.125 | 0.160 | 0.0015 | 3.0 |
| copper | 400.0 | 0.125 | 0.160 | 0.0080 | 0.0 |
| ablefilm | 1.0 | 0.125 | 0.160 | 0.0020 | 3.9 |
| alumina | 25.0 | 0.125 | 0.160 | 0.0020 | 0.2 |
| copper | 400.0 | 0.125 | 0.160 | 0.0050 | 0.0 |
| solder | 50.0 | 0.125 | 0.160 | 0.0050 | 0.2 |
| | | | | total | 7.6 |

FIG. 8

HEAT DISSIPATION FOR ELECTRONIC COMPONENTS

BACKGROUND

This invention relates to heat dissipation for electronic components.

A DC-to-DC power converter of the kind shown in U.S. Pat. No. 5,987,740, incorporated by reference, for example, includes a heat-generating semiconductor device and a metal base plate that acts as a heat sink to dissipate heat from the device to the outside world.

Figure 1:
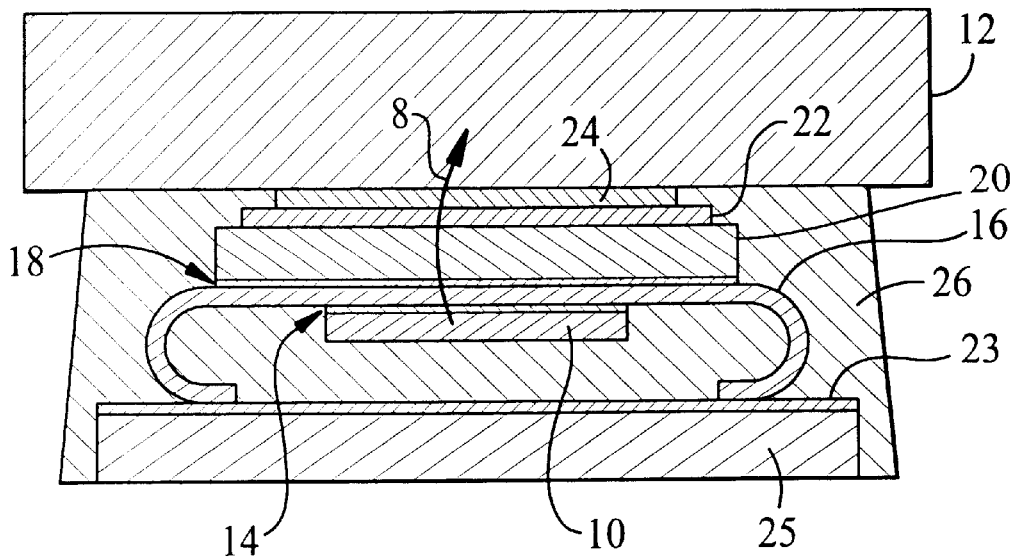

As shown in FIG. 1, one path 8 for conducting heat from the device 10 to the base plate 12 where it can be dissipated is through silver filled epoxy 14, a lead frame of copper conductors 16, alumina-filled epoxy 18, an alumina piece 20, a copper layer 22 to which the alumina has been directly bonded, and solder 24. The lead frame conductors are soldered to copper runs 23 on the surface of a printed circuit board 25. The assembly is potted in a molding compound 26.

The alumina piece 20 provides a relatively high thermal conductivity for good heat transfer to the base plate and a low capacitance between the copper lead frame and the base plate. A low capacitance is useful in reducing noise in the high-frequency signals that propagate in a DC-to-DC switching power converter.

Figure 2:
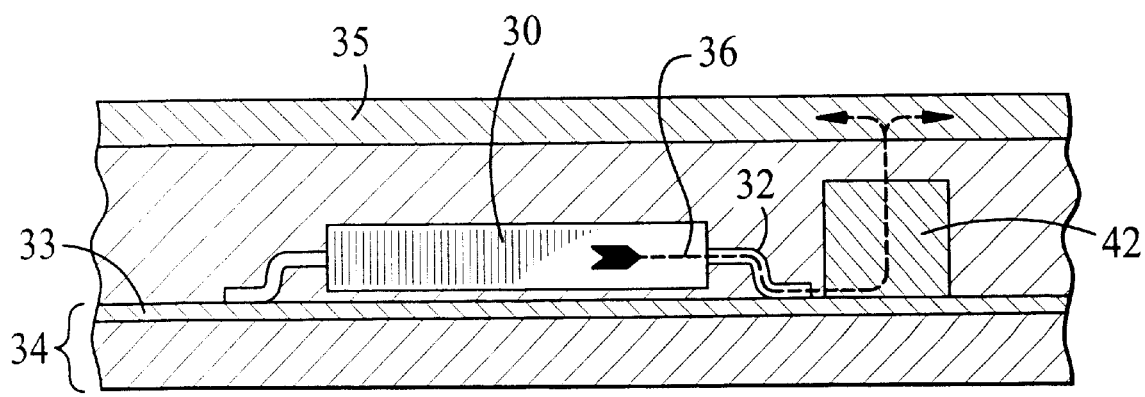

In another approach, shown in FIG. 2, the heat-generating device 30 has conventional leads 32 that permit surface mounting on copper runs 33 of a printed circuit board 34. Heat is conducted to the base plate 35 along a path 36 that includes the leads, the circuit runs 33 of the board 34, metal columns 42, and a silicone layer 44.

SUMMARY

In general, in one aspect, the invention features apparatus that includes (1) a circuit board, (2) a heat dissipator separated from the board by a gap, (3) a heat generating electronic device mounted in the gap, and (4) a heat conducting path between the device and the dissipator. The heat-conducting path includes a path segment that spans the gap at a location adjacent to the device. The path segment includes an electrically insulating material having a thermal conductivity of at least 7 W/m-° K.

In general, in another aspect, the heat-conducting path including a path segment that passes along the conductive runs and another path segment that spans the gap at a location adjacent to the device. The other path segment includes by a piece of electrically insulating material that has a thermal conductivity of at least 7 W/m-° K.

Implementations of the invention may include one or more of the following features. The device includes a semiconductor power component, e.g., a semiconductor die and a copper base. The electrically insulating material comprises alumina that has a solderable material, such as direct bonded copper, on two opposite faces. The solderable material is soldered to the conductive runs and to the base plate. There are two parallel path segments that span the gap at two different locations adjacent to the device. The device is connected to a lead frame on the board. The device, the board, and the path segment are potted in a molding compound. The heat dissipator comprises a metal base plate.

In general, in another aspect, the invention features a power converter comprising (1) a heat generating power component mounted on a circuit board in a gap between the board and a heat sinking base plate, and (2) two thermally conductive and electrically insulating chimneys mounted adjacent to the device, spanning the gap, and configured to provide parallel paths for conducting heat, which has passed from the device to the board, from the board to the base plate.

Implementations of the invention may include one or more of the following features. Each of the chimneys includes predominantly a non-metallic piece, e.g., alumina that has direct bonded copper on two opposite faces.

In general, in another aspect, the invention features a method that includes conducting heat from a heat generating electronic device that is mounted in a gap between a circuit board and a heat dissipator, the heat being conducted along a path that includes a path segment that passes along conductive runs on the circuit board and another segment that spans the gap at a location adjacent to the device, the other path segment being spanned predominantly by a non-metallic piece that has a thermal conductivity of at least 7 W/m-° K.

Among the advantages of the invention are one or more of the following. Heat is removed effectively from the heat-generating device. The alumina thermal chimney provides good thermal conductivity, high dielectric strength and a high dielectric constant. Effective electrical isolation and low capacitance is provided between the heat sink and the circuit. The structure is mechanically rugged and inexpensive to make and is based on well-known manufacturing processes. The structure is shorter than other approaches (e.g., 0.040" compared to 0.080") which yields a higher power density for a given converter circuit.

Other advantages and features may be apparent from the following description and from the claims.

DESCRIPTION

Figure 3:
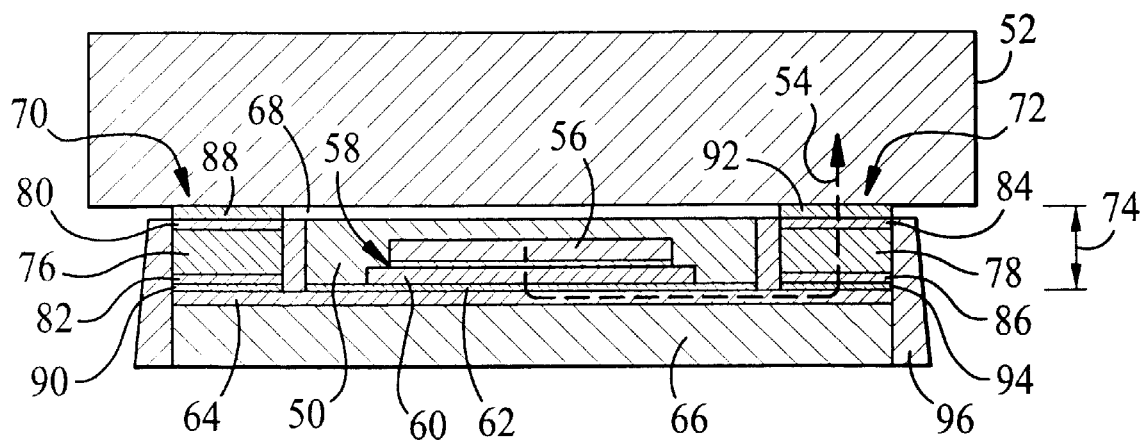

FIGS. 1, 2, and 3 are sectional side views of heat dissipation schemes for heat generating devices.

Figure 4:
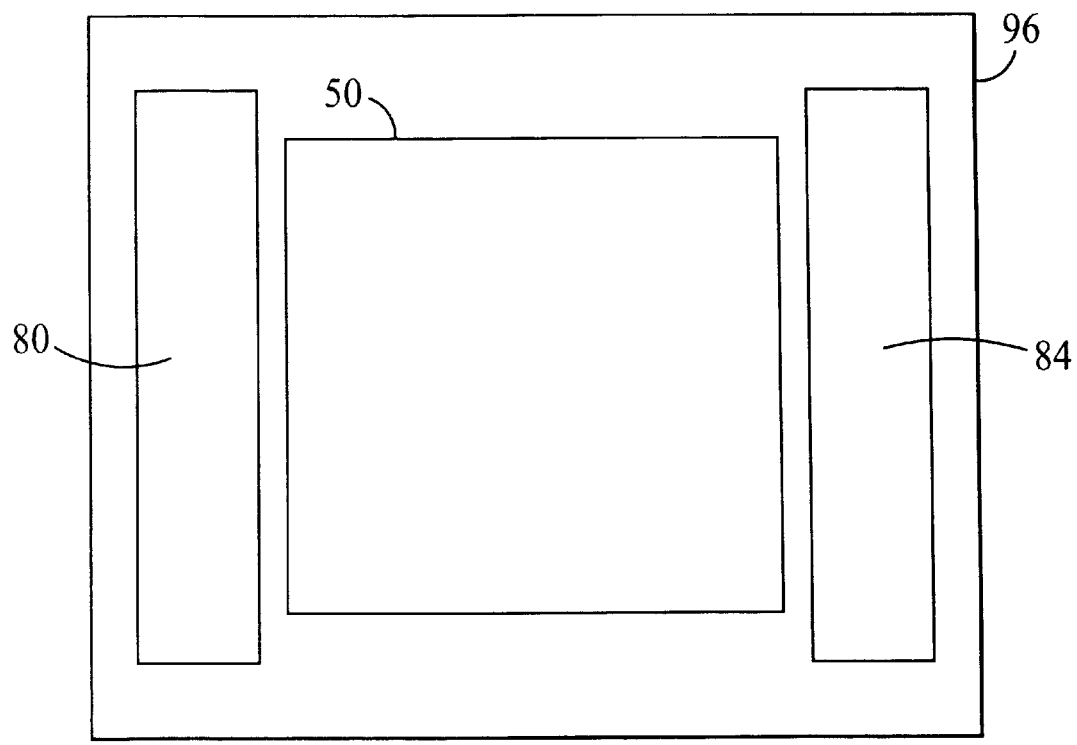

FIG. 4 is top view of the assembly of FIG. 3 before attachment of the base plate.

Figure 5:
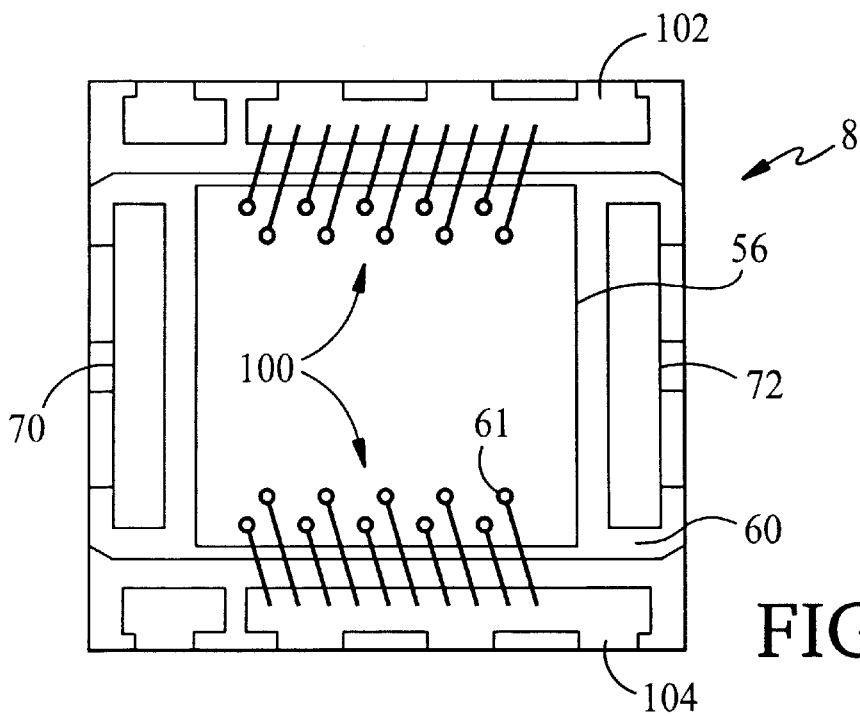
Figure 6:
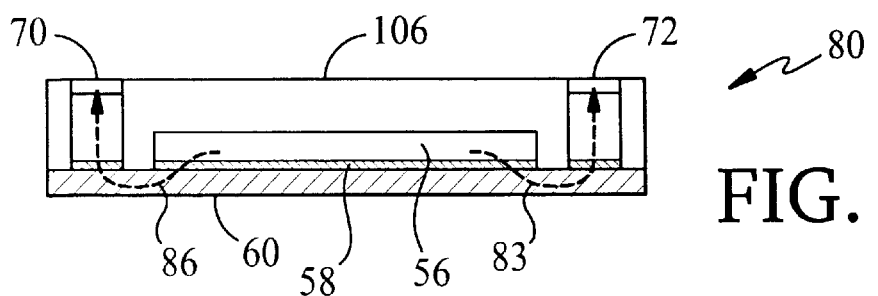
Figure 7:
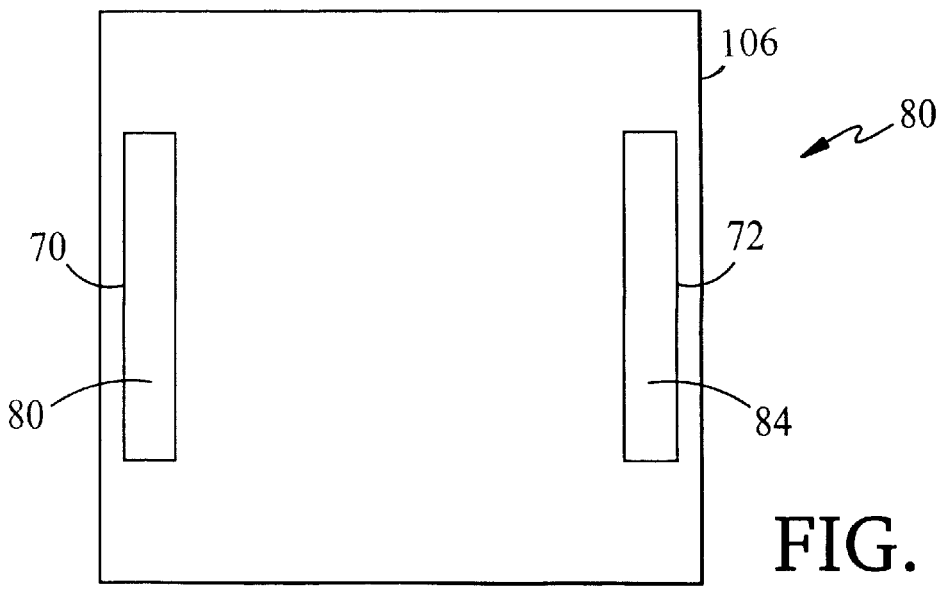

FIGS. 5, 6, and 7 are a top view of an assembly during manufacture and a side view and a top view at a later stage of manufacture.

FIG. 8 is a table.

As shown in FIGS. 3 and 4, heat can be conducted from a heat generating packaged electronic device 50 to a heat sinking metal base plate 52 along a path 54. The device 50 includes a semiconductor power component 56 attached by solder or epoxy 58 to a portion of a copper lead frame 60. Termination pads on the top of the semiconductor device are connected to other portions of the lead frame (for example, by means of bond wires, not shown in the figure). The copper lead frame 60 is in turn soldered 62 to conductive runs 64 on a printed circuit board 66.

A small gap 68 separates the top surface of the device from the bottom surface of the base plate. To each side of the device, a thermal chimney 70, 72 spans the larger gap 74 between the top surface of the circuit board conductive runs and the bottom surface of the base plate. Each of the chimneys includes a long rectangular alumina piece 76, 78 with direct bonded copper layers 80, 82, 84, 86 on the top and bottom faces. Solder 88, 90, 92, 94 connects the alumina pieces to the printed circuit runs and to the base plate. The entire assembly (except for the base plate) is potted in a molding compound 96 before attachment to the base plate. Laser etching may be used to clean away excess molding compound on the top surface of the potted assembly to expose the top surfaces of the copper layers 80, 84.

As shown in FIG. 4 the packaged electronic device 50 and the chimneys 70, 72 are separate components which are individually mounted on conductive runs 64 on the printed circuit board 66. In an alternate packaging arrangement, shown in FIGS. 5 through 7, both the semiconductor power component 56 and the chimneys 70, 72 are contained within a single packaged device 80. The semiconductor device 56 is mounted on a portion of a lead frame 60 by conductive material 58 (e.g., conductive epoxy or solder). Bond wires 100 electrically connect the upper surface of the semiconductor device to other portions of the lead frame 102, 104. The thermal chimneys 70, 72 are attached (by conductive material) to the portion of the lead frame 60 onto which the power component 56 is mounted to provide low thermal resistance paths, indicated by arrows 83, 85, between the power component and the chimneys. The assembly is encapsulated in molding compound 106. Surfaces 80, 84 are left exposed during the molding process or are re-exposed by a post molding process such as laser etching, for subsequent connection to a heat sink.

If configured for equal thermal resistances, the arrangement of FIG. 4 provides lower capacitance between the circuit etch (64, FIG. 4; 33, FIG. 2) and the base plate than the arrangement of FIG. 2.

We compare the arrangement of FIG. 2 including a high thermal conductivity silicone having a thermal conductivity of 1 W/m-° K and a dielectric constant of 3.3 to the arrangement of FIG. 4 including alumina chimneys having a thermal conductivity of 25 W/m-° K and a dielectric constant of 9.9. For equal cross-sectional areas of the chimneys 76, 78 and the metal columns 42, equality in thermal resistance would require that the thickness of the silicone layer (between the top of the metal column and the baseplate in FIG. 2) be approximately 4% of the length of the alumina chimney in FIG. 4. As a result, the capacitance of FIG. 4 would be approximately 12% of the capacitance of FIG. 2.

High thermal conductivity combined with low dielectric constant are desirable features in heat removal systems of the kinds shown in FIGS. 2 and 4. An increase in a figure-of-merit defined as the ratio of the thermal conductivity and the dielectric constant will result in an improved heat removal path. For the alumina chimney described above the figure-of-merit is 2.53, whereas the figure-of-merit for the system having a metal slug and silicone, also described above, is 0.30. The alumina system is superior.

The relative capacitances of two systems, for the same cross sectional areas and thermal resistances, is inversely proportional to the figures-of-merit of the systems; in the example just given the inverse ratio is 0.03/2.53 which corresponds to the 12% figure given above. Silicones and related materials suitable for potting electronic assemblies have thermal conductivities below 7 W/m-° K, whereas thermal conductivities of insulating ceramics used in electronic assemblies are typically above 10 W/m-° K.

FIG. 8 is a table showing thermal resistance calculations for the heat dissipation paths of FIGS. 3 and 4 (assuming one chimney or two) at the top of the table and for the dissipation path of FIG. 1 at the bottom of the table. With two chimneys, the cumulative thermal resistance (rise per watt) is 7.1 compared to 7.6 for the path of FIG. 1.

Other implementations are within the scope of the following claims. For example, the chimneys can comprise thermally conductive and electrically insulating materials other than alumina, for example, beryllium oxide or aluminum nitride. Solderable material may be applied to the faces of the chimneys other than by direct bond copper. Alternatively, if a face of a chimney is to be connected, either to a conductive etch or to a base plate, by thermally conductive adhesive, it can be left bare.

What is claimed is:

1. Apparatus comprising
   a circuit board,
   a heat dissipator separated from the board by a gap,
   a heat generating electronic device mounted in the gap, and
   a heat conducting path between the device and the dissipator,
   the heat conducting path including a first path segment and a second path segment connected to the first path segment, the first path segment including a lead frame, the second path segment spanning the gap at a location adjacent to the device, comprising an electrically insulating material having a thermal conductivity of at least 7 W/m-° K, and spanning at least half of the gap with the electrically insulating material.

2. Apparatus comprising
   a circuit board having conductive runs,
   a heat dissipator separated from the board by a gap,
   a heat generating electronic device mounted in the gap, and
   a heat conducting path between the device and the dissipator,
   the heat conducting path including a first path segment that passes along the conductive runs and a second path segment connected to the first path segment, the second path segment spanning the gap at a location adjacent to the device, including a piece of electrically insulating material that has a thermal conductivity of at least 7 W/m-° K, and spanning at least half of the gap with the electrically insulating material.

3. The apparatus of claim 1 or 2 in which the heat generating electronic device comprises a semiconductor power component.

4. The apparatus of claim 1 or 2 in which the heat generating electronic device comprises a semiconductor die and a copper base.

5. The apparatus of claim 1 or 2 in which the electrically insulating material comprises alumina.

6. The apparatus of claim 5 in which the alumina has solderable material on two opposite faces.

7. The apparatus of claim 6 in which the solderable material comprises direct bonded copper.

8. The apparatus of claim 6 in which the solderable material is soldered to the conductive runs and to the heat dissipator.

9. The apparatus of claim 1 or 2 in which there are two parallel path segments that span the gap at two different locations adjacent to the heat generating electronic device.

10. The apparatus of claim 2 also including a lead frame on the board to which the heat generating electronic device is connected.

11. The apparatus of claim 1 or 2 also including a molding compound in which the heat generating electronic device, the circuit board and the heat conducting path segment are potted.

12. The apparatus of claim 1 or 2 in which the heat dissipator comprises a metal base plate.

13. A power converter comprising
    a heat generating power component mounted on a circuit board in a gap between the board and a heat sinking base plate, and two thermally conductive and electrically insulating chimneys mounted adjacent to the device and thermally coupled to the device by a thermally conductive segment on the board, the chimneys spanning the gap, comprising an electrically insulating material spanning at least half of the gap, and being configured to provide parallel paths for conducting heat from the heat generating power component through the thermally conductive segment to the base plate.

14. The apparatus of claim 13 in which the heat generating power component comprises a semiconductor power component.

15. The apparatus of claim 13 in which each of the chimneys comprises predominantly a non-metallic piece.

16. The apparatus of claim 14 in which the non-metallic piece comprises alumina that has direct bonded copper on two opposite faces.

17. A method comprising conducting heat from a heat generating electronic device that is mounted in a gap between a circuit board and a heat dissipator, the heat being conducted along a path that includes a first path segment that passes along conductive runs on the circuit board and a second path segment connected to the first path segment that spans the gap at a location adjacent to the device, the second path segment being spanned predominantly by a non-metallic piece that has a thermal conductivity of at least 7 W/m-° K.

* * * * *